(12) United States Patent
Den Boef et al.

(10) Patent No.: US 7,791,724 B2
(45) Date of Patent: Sep. 7, 2010

(54) CHARACTERIZATION OF TRANSMISSION LOSSES IN AN OPTICAL SYSTEM

(75) Inventors: Arie Jeffrey Den Boef, Waalre (NL); Wilhelmus Maria Corbeij, Eindhoven (NL); Mircea Dusa, Campbell, CA (US); Markus Gerardus Martinus Van Kraaij, Mierlo (NL)

(73) Assignee: ASML Netherlands B.V., Veldhoven (NL)

(*) Notice: Subject to any disclaimer, the term of this patent is extended or adjusted under 35 U.S.C. 154(b) by 658 days.

(21) Appl. No.: 11/451,599

(22) Filed: Jun. 13, 2006

(65) Prior Publication Data

US 2007/0296960 A1 Dec. 27, 2007

(51) Int. Cl.
*G01J 4/00* (2006.01)
(52) U.S. Cl. .................. 356/369; 356/370
(58) Field of Classification Search ........... 356/73.1, 356/121–123, 213–236, 337–343, 364, 369, 356/394; 385/12; 398/28, 29
See application file for complete search history.

(56) References Cited

U.S. PATENT DOCUMENTS

| | | | | |
|---|---|---|---|---|
| 4,526,466 A * | 7/1985 | Sandercock | ............... | 356/71 |
| 5,703,692 A | 12/1997 | McNeil et al. | ............... | 356/445 |
| 5,880,838 A | 3/1999 | Marx et al. | ............... | 356/351 |
| 5,963,329 A | 10/1999 | Conrad et al. | ............... | 356/372 |
| 6,320,657 B1 * | 11/2001 | Aspnes et al. | ............... | 356/369 |
| 6,522,406 B1 | 2/2003 | Rovira et al. | | |
| 6,608,690 B2 | 8/2003 | Niu et al. | ............... | 356/635 |
| 6,699,624 B2 | 3/2004 | Niu et al. | ............... | 430/5 |
| 6,704,661 B1 | 3/2004 | Opsal et al. | ............... | 702/27 |
| 6,721,039 B2 | 4/2004 | Ozawa | | |
| 6,721,094 B1 * | 4/2004 | Sinclair et al. | ............... | 359/386 |
| 6,721,691 B2 | 4/2004 | Bao et al. | ............... | 702/189 |
| 6,738,138 B2 | 5/2004 | Wei | ............... | 356/369 |
| 6,753,961 B1 | 6/2004 | Norton et al. | ............... | 356/364 |
| 6,768,983 B1 | 7/2004 | Jakatdar et al. | ............... | 706/46 |
| 6,772,084 B2 | 8/2004 | Bischoff et al. | ............... | 702/127 |
| 6,785,638 B2 | 8/2004 | Niu et al. | ............... | 702/189 |
| 6,813,034 B2 | 11/2004 | Rosencwaig et al. | ............... | 356/601 |
| 6,819,426 B2 | 11/2004 | Sezginer et al. | ............... | 356/401 |
| 6,856,408 B2 | 2/2005 | Raymond | ............... | 356/601 |

(Continued)

FOREIGN PATENT DOCUMENTS

EP 1 154 330 A2 11/2001

(Continued)

OTHER PUBLICATIONS

European Search Report issued for European Patent Application No. 07252242.8-1226, dated Sep. 28, 2007.

(Continued)

*Primary Examiner*—Tarifur Chowdhury
*Assistant Examiner*—Tara S Pajoohi
(74) *Attorney, Agent, or Firm*—Sterne, Kessler, Goldstein & Fox P.L.L.C

(57) ABSTRACT

The illumination profile of a radiation beam is initially measured using a CCD detector. A reference mirror is then placed in the focal plane of the high aperture lens and the reflected radiation measured. By comparing the illumination profile and the detected radiation it is possible to determine the transmission losses for S and P polarisation which can then be used in scatterometry modeling.

21 Claims, 5 Drawing Sheets

U.S. PATENT DOCUMENTS

| | | |
|---|---|---|
| 6,919,964 B2 | 7/2005 | Chu .......................... 356/601 |
| 6,928,628 B2 | 8/2005 | Seligson et al. ................ 716/4 |
| 6,972,852 B2 | 12/2005 | Opsal et al. ................. 356/625 |
| 6,974,962 B2 | 12/2005 | Brill et al. .................... 250/548 |
| 6,987,572 B2 | 1/2006 | Lakkapragada et al. ..... 356/601 |
| 7,046,376 B2 | 5/2006 | Sezginer .................... 356/601 |
| 7,061,615 B1 | 6/2006 | Lowe-Webb ................ 356/401 |
| 7,061,623 B2 | 6/2006 | Davidson .................... 356/497 |
| 7,061,627 B2 | 6/2006 | Opsal et al. ................. 356/601 |
| 7,068,363 B2 | 6/2006 | Bevis et al. ............. 356/237.5 |
| 2003/0043375 A1 | 3/2003 | Opsal ......................... 356/369 |
| 2004/0119970 A1 | 6/2004 | Dusa et al. .............. 356/237.1 |
| 2005/0088663 A1 | 4/2005 | De Groot et al. |
| 2006/0033921 A1 | 2/2006 | Den Boef et al. |
| 2006/0066855 A1 | 3/2006 | Den Boef et al. ........... 356/401 |
| 2006/0126074 A1 | 6/2006 | Van Der Werf et al. ..... 356/489 |
| 2006/0139592 A1 | 6/2006 | Den Boef et al. ............. 355/53 |

FOREIGN PATENT DOCUMENTS

| | | |
|---|---|---|
| EP | 1 186 956 A2 | 3/2002 |
| EP | 1 615 062 A2 | 1/2006 |
| KR | 2001-86320 A | 9/2001 |

OTHER PUBLICATIONS

Korean Office Action and Translation for Application No. 10-2007-0057156 mailed Nov. 14, 2008, 6 pgs.

\* cited by examiner

CHARACTERIZATION OF TRANSMISSION LOSSES IN AN OPTICAL SYSTEM

BACKGROUND OF THE INVENTION

1. Field of the Invention

The present invention relates to a method of characterizing the transmission losses of an optical system and a method of measuring properties of a substrate.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

Sensors are known for inspecting substrates during or after lithographic processes. For example, after a resist on a substrate is developed (having been exposed by a patterned beam of radiation, for example) a measurement and inspection step may be performed. This is referred to as "in-line" because it is carried out in the normal course of processing substrates used in production. This may serve two purposes. Firstly, it is desirable to detect any areas where the pattern in the developed resist is faulty. If a sufficient number of dies on a substrate, namely portions of the substrate that will be used to form an individual device are faulty, the substrate can be stripped of the patterned resist and re-exposed, hopefully correctly, rather than making the fault permanent by carrying out a subsequent process step, for example an etch, with a faulty pattern. Secondly, the measurements may allow errors in the lithographic apparatus, for example illumination settings or exposure dose, to be detected and correct for subsequent exposures. However, many errors in the lithographic apparatus cannot easily be detected or quantified from the patterns printed in resist. Detection of a fault does not always lead directly to its cause. Thus, a variety of "off-line" procedures for detecting and measuring errors in a lithographic apparatus are also known. This may involve replacing the substrate with a measuring device or carrying out exposures of special test patterns, for example at a variety of different machine settings. Such off-line techniques take time, often a considerable amount, during which the end products of the apparatus will be of an unknown quality until the measurement results are made available. Therefore, in-line techniques, ones which can be carried out at the same time as production exposures, for detecting and measuring errors in the lithographic apparatus, are preferred.

Scatterometry is one example of an optical metrology technique that can be used for in-line measurements of CD and overlay. There are two main scatterometry techniques:

1) Spectroscopic scatterometry measures the properties of scattered light at a fixed angle as a function of wavelength, usually using a broadband light source such as Xenon, Deuterium, or a Halogen based light source. The fixed angle can be normally incident or obliquely incident.

2) Angle-resolved scatterometry measures the properties of scattered light at a fixed wavelength as a function of angle of incidence, often using a laser as a single wavelength light source or a broadband source in combination with a wavelength selection device such as a narrow band interference filter, a dispersive prism or a diffraction grating.

The structure giving rise to a reflection spectrum is reconstructed, e.g. using real-time regression or by comparison to a library of patterns derived by simulation. Reconstruction involves minimization of a cost function. Both approaches calculate the scattering of light by periodic structures. The most common technique is Rigorous Coupled-Wave Analysis (RCWA), though light scattering can also be calculated by other techniques such as FDTD or Integral Equation techniques. Such angle-resolved scatterometry is described in more detail in U.S. Patent Application Publication 2006/0033921 A1.

Scatterometry can also be used to inspect features formed after an etch process (which may, for example, have been controlled by a pattern formed by a lithographic process) or to measure the thickness or properties of one or more layers of material formed in a stack.

In order to perform angle-resolved scatterometry measurements, the substrate is illuminated with radiation. In order to obtain the most information from the measurements, the radiation illuminating the substrate may be linearly polarized. To obtain a high resolution a lens with a high numerical aperture (NA) is used. Preferably the NA has a value of at least 0.95. The high aperture lens is rotational symmetric but has polarization-dependent transmittance. FIG. 6 shows the pupil plane of the high aperture lens and as can be seen the transmissions at each point can be broken down into an S component and P component. In general S polarized light suffers higher transmission losses than P polarized light which can lead to a net distortion of the measured angle-resolved scatterspectrum.

SUMMARY OF THE INVENTION

It is therefore an object of the present invention to minimise the effect of different transmission losses between the P and S polarizations.

According to an embodiment of the invention there is provided a method of characterising the transmission losses of an optical system comprising measuring the illumination profile of a radiation beam; projecting the radiation beam through the optical system; measuring the intensity distribution of the radiation beam projected through the optical system; and comparing the measured spectrum and the illumination profile to characterise the transmission losses.

According to a further embodiment of the invention there is provided a method of measuring properties of a substrate comprising projecting a radiation beam onto a substrate; and detecting the intensity distribution of the reflected radiation beam that is indicative of the properties to be measured, wherein the transmission losses measured by a method according to a method as described above are subtracted from the reflected radiation beam.

According to a further embodiment of the invention there is provided an inspection apparatus configured to measure a property of a substrate comprising a radiation projector configured to project radiation onto the substrate; a detector configured to detect the radiation reflected from the substrate; and a data handling unit configured to normalize the detected radiation beam by taking into account the transmission losses suffered by P and S polarized light.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
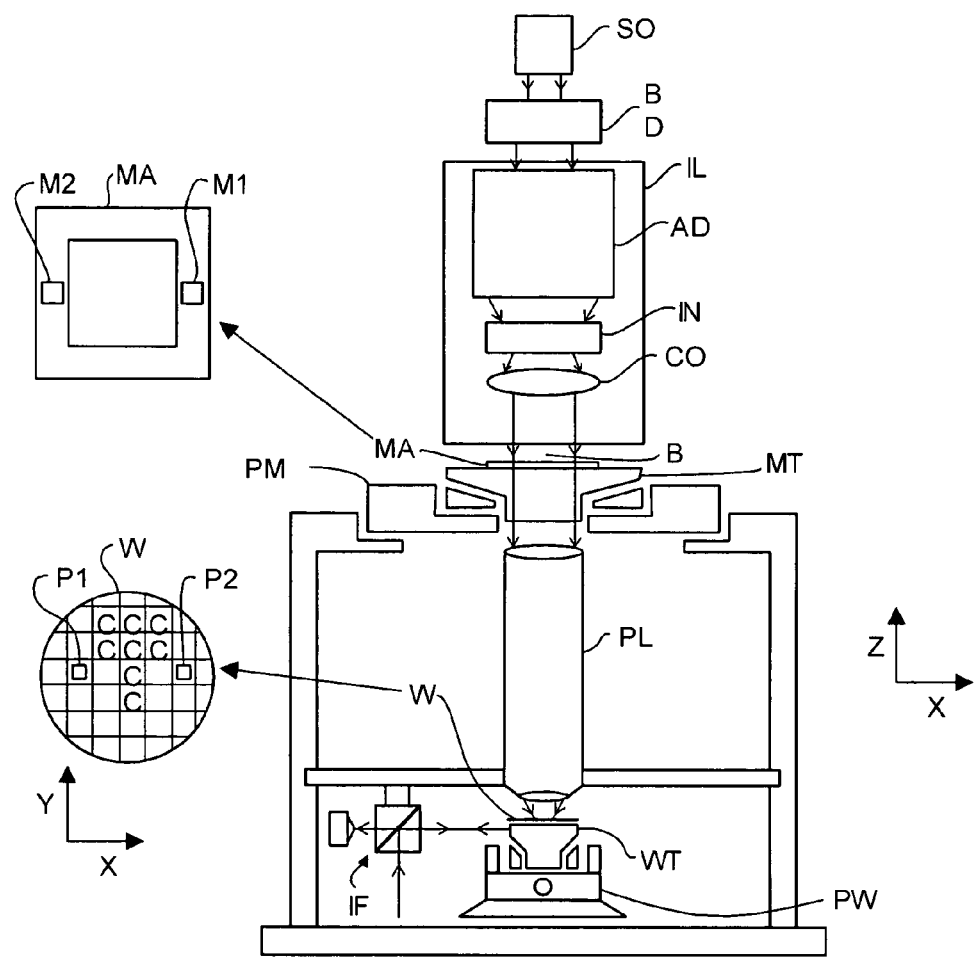
FIG. 1 depicts a lithographic apparatus according to an embodiment of the invention.

FIG. 1 schematically depicts a lithographic apparatus used in conjunction with the invention. The apparatus comprises an illumination system (illuminator) IL configured to condition a radiation beam B (e.g. UV radiation or DUV radiation). A support (e.g. a mask table) MT is configured to support a patterning device (e.g. a mask) MA and is connected to a first positioner PM configured to accurately position the patterning device in accordance with certain parameters. A substrate table (e.g. a wafer table) WT is configured to hold a substrate (e.g. a resist-coated wafer) W and is connected to a second positioner PW configured to accurately position the substrate in accordance with certain parameters. A projection system (e.g. a refractive projection lens system) PL configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, to direct, shape, and/or control radiation.

The support supports, e.g. bears the weight of, the patterning device. It holds the patterning device in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate.

It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
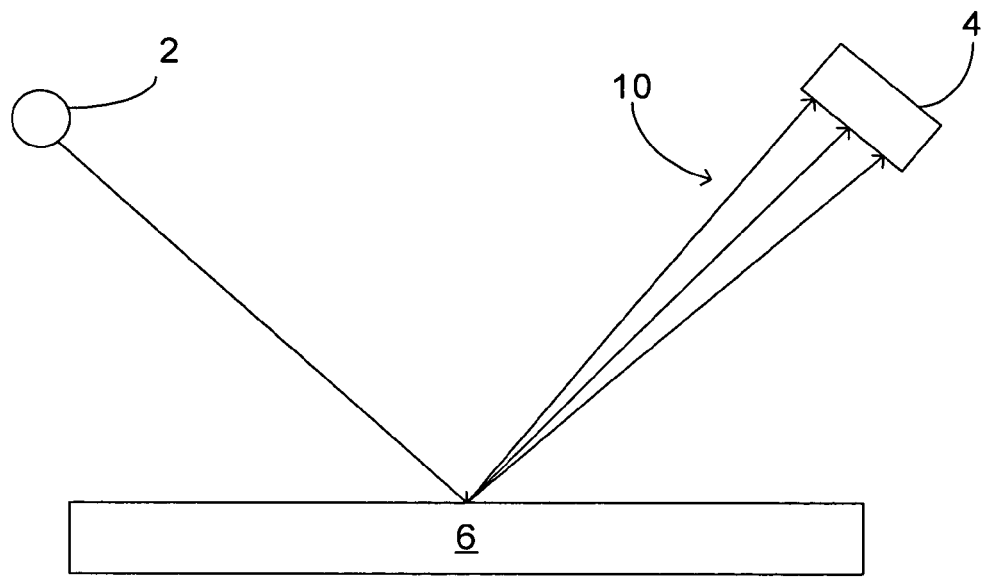
FIG. 2 depicts a scatterometer.
Figure 2:
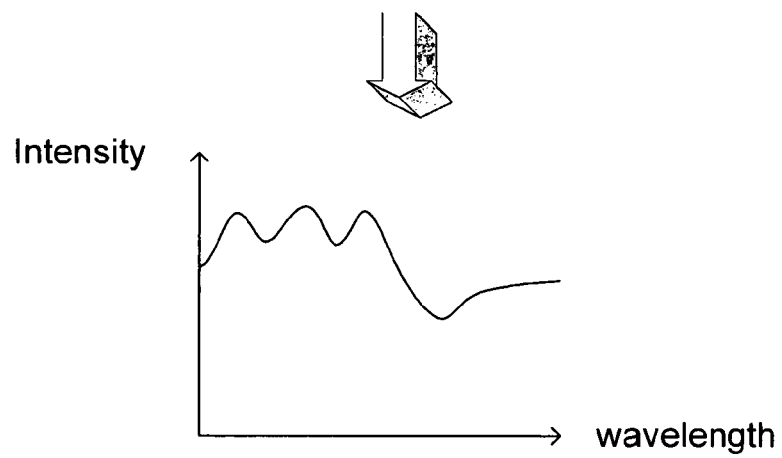
Figure 2:
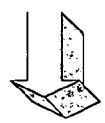
Figure 2:
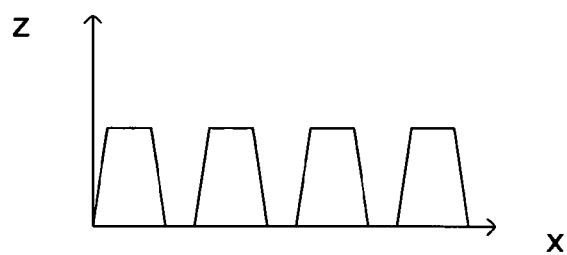

The properties of the surface of a substrate W may be determined using a sensor such as a scatterometer such as that depicted in FIG. 2. The scatterometer comprises a broadband (white light) radiation projector 2 which projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconstructed, e.g. by Rigorous Coupled Wave Analysis and non-linear regression or by comparison with a library of simulated spectra as shown at the bottom of FIG. 2. In general, for the reconstruction the general form of the structure is known and some parameters are assumed from knowledge of the process by which the structure was made, leaving only a few parameters of the structure to be determined from the scatterometry data.

The scatterometer may be a normal-incidence scatterometer or an oblique-incidence scatterometer. Variants of scatterometry may also be used in which the reflection is measured at a range of angles of a single wavelength, rather than the reflection at a single angle of a range of wavelengths.

Figure 3:
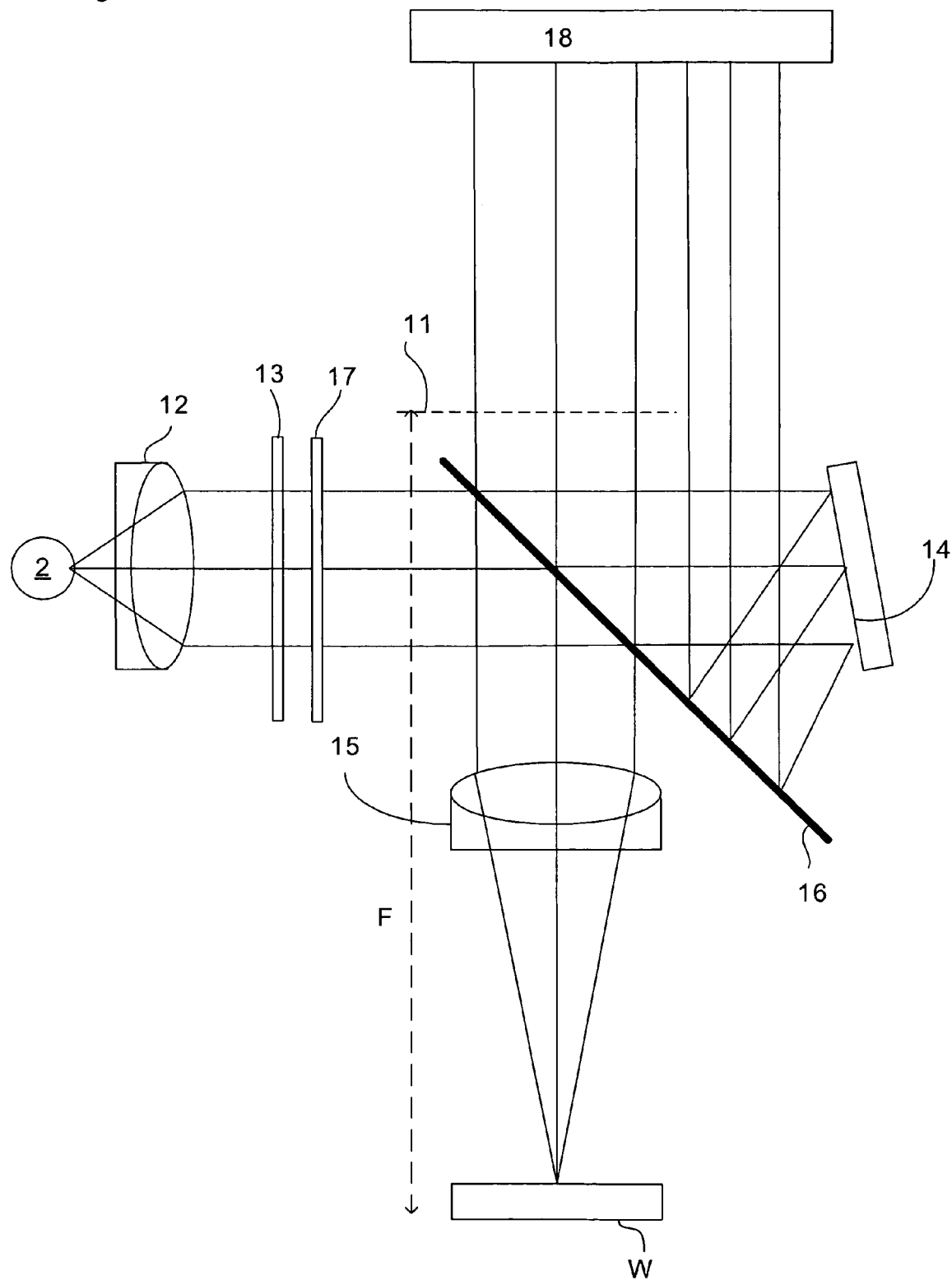
FIG. 3 depicts the general operating principle of measuring an angle resolved spectrum in the pupil plane of a high-NA lens.

Scatterometers for measuring properties of a substrate may measure, in the pupil plane 11 of a high numerical aperture lens, the properties of an angle-resolved spectrum reflected from the substrate surface W at a plurality of angles and wavelengths as shown in FIG. 3. Such a scatterometer may comprise a radiation projector 2 for projecting radiation onto the substrate and a detector 14 for detecting the reflected spectra. The pupil plane is the plane in which the radial position of radiation defines the angle of incidence and the angular position defines azimuth angle of the radiation. The detector 14 is placed in the pupil plane of the high numerical aperture lens. The numerical aperture may be high and preferably at least 0.9 and more preferably at least 0.95. Immersion scatterometers may even have lenses with numerical apertures over 1.

Some angle-resolved scatterometers only measure the intensity of scattered light. However, more recent scatterometers allow several wavelengths to be measured simultaneously at a range of angles. The properties measured by the scatterometer for different wavelengths and angles may be the intensity of transverse magnetic- and transverse electric-polarized light and the phase difference between the transverse magnetic- and transverse electric-polarized light.

Using a broadband light source (i.e. one with a wide range of light frequencies or wavelengths—and therefore of colors) is possible, which gives a large etendue, allowing the mixing of multiple wavelengths. The plurality of wavelengths in the broadband preferably each has a bandwidth of, say, $\delta\lambda$ and a spacing, therefore, of at least $2\delta\lambda$ (i.e. twice the wavelength). Several "sources" of radiation can be different portions of an extended radiation source which have been split using, say, fiber bundles. In this way, angle resolved scatter spectra can be measured at multiple wavelengths in parallel. A 3-D spectrum (wavelength and two different angles) is measured, which contains more information than a 2-D spectrum. This allows more information to be measured which increases metrology process robustness. This is described in more detail in U.S. Patent Application Publication 2006/0033921 A1.

A scatterometer that may be used with the present invention is shown in FIG. 3. The radiation of the radiation projector 2 is focused using lens system 12 through interference filter 13 and polariser 17, reflected by partially reflected surface 16 and is focused onto substrate W via a microscope objective lens 15. The radiation is then transmitted through partially reflective surface 16 into a CCD detector in the back projected pupil plane 11 in order to have the scatter spectrum detected. The pupil plane 11 is at the focal length of the lens system 15. A detector and high aperture lens are placed at the pupil plane. The pupil plane may be re-imaged with auxiliary optics since the pupil plane of a high-NA lens is usually located inside the lens.

A reference beam is often used for example to measure the intensity of the incident radiation. When the radiation beam is incident on the beam splitter 16 part of it is transmitted through the beam splitter towards a reference mirror 14. The reference beam is then projected onto a different part of the same CCD detector 18.

The pupil plane of the reflected radiation is imaged on the CCD detector with an integration time of, for example, 40 milliseconds per frame. In this way, a two-dimensional angular scatter spectrum of the substrate targets is imaged on the detector. The detector may be, for example, an array of CCD or CMOW sensors.

A set of interference filters 13 is available to select a wavelength of interest in the range of, say, 405-790 nm or even lower, such as 200-300 nm. The interference filter may be tunable rather than comprising a set of different filters. A grating could be used instead of interference filters.

The substrate W may be a grating which is printed such that after development, the bars are formed of solid resist lines. The bars may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the grating, such as line widths and shapes, may be input to the reconstruction process from knowledge of the printing step and/or other scatterometry processes.

As discussed above, the transmission of light through the high NA lens is polarisation dependent and varies along the radial position in the pupil plane. This results in scaling errors in the measured scatterspectrum which in turn leads to errors in the reconstructed profile. In order to obtain a correct reconstruction of the grating profile the radially dependent transmission losses should be incorporated into the reconstruction algorithm.

Figure 4:
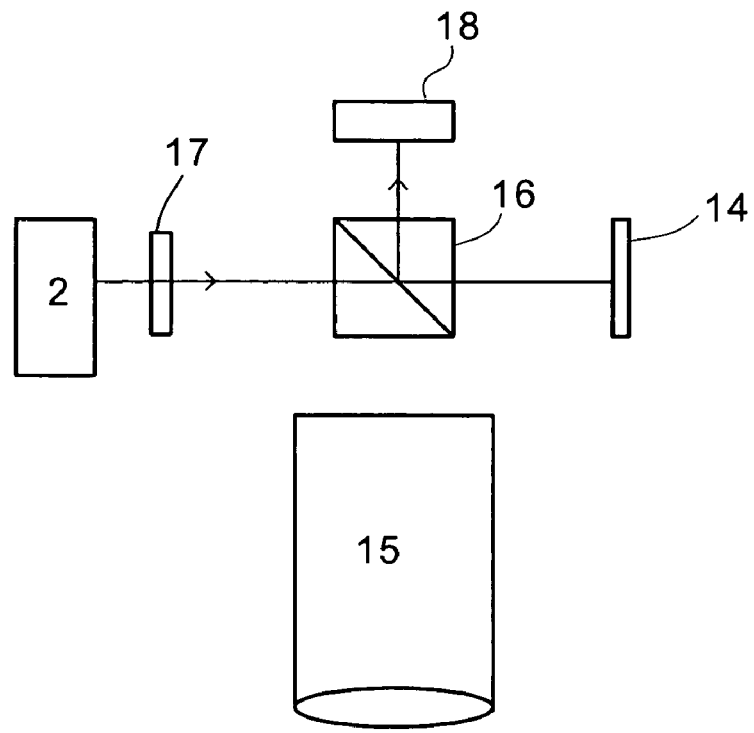
FIG. 4 depicts the apparatus used in a first step of the invention.

A first step of the invention is depicted in FIG. 4. The illumination beam used in the scatterometry measurement has a spatially varying intensity $I_{ill}(k_x, k_y)$ where $k_x$ and $k_y$ are positioned in the pupil plane. Prior to projecting the illumination beams through the beam splitter the illumination beam is linearly polarised by polariser 17 along one of the eigen-polarizations of the beam splitter 16 used in scatterometry measurements. Part of the illumination beam is transmitted through the beam splitter to the reference mirror 14 while part of it is reflected by the beam splitter towards the high aperture lens 15. For this step of the invention the focal plane of the high aperture lens should preferably be empty. Furthermore, in the normal course of use the reference mirror is often tilted such that the reference beam (i.e. the portion reflected by the reference mirror) is projected onto the CCD detector 18 alongside the main scatterometry beam projected through the high aperture lens. The reference beam is thus projected onto a different portion of the CCD detector 18. In such a situation it is preferable for the first step in the invention to tilt the reference mirror such that the reflected beam is projected onto the main portion of the CCD detector 18 i.e. the portion onto which the scatterometry beam is usually projected. This reduces errors introduced by the different sensitivities of different CCD elements. After this first step the reference mirror can be re-tilted to its original position. After reflection by the reference mirror the beam is reflected by the beam splitter 16 towards the CCD detector 18. The resulting measured CCD signal is:

$$M_{ill}(k_x,k_y)=S_{CCD}T_{BS}R_{BS}R_{ref}I_{ill}(k_x,k_y)$$

where $T_{BS}$ and $R_{BS}$ are the transmittance and reflectance respectively of the beam splitter (suitable values for these may be approximately 0.5 but it is not necessary to know these figures accurately). $R_{ref}$ is the intensity reflectance of the reference mirror which is assumed to be independent of $k_x$ and $k_y$. $S_{CCD}$ is an unknown scaling factor. This first step of the invention allows the spatial profile of the illumination beam to be characterised.

Figure 5:
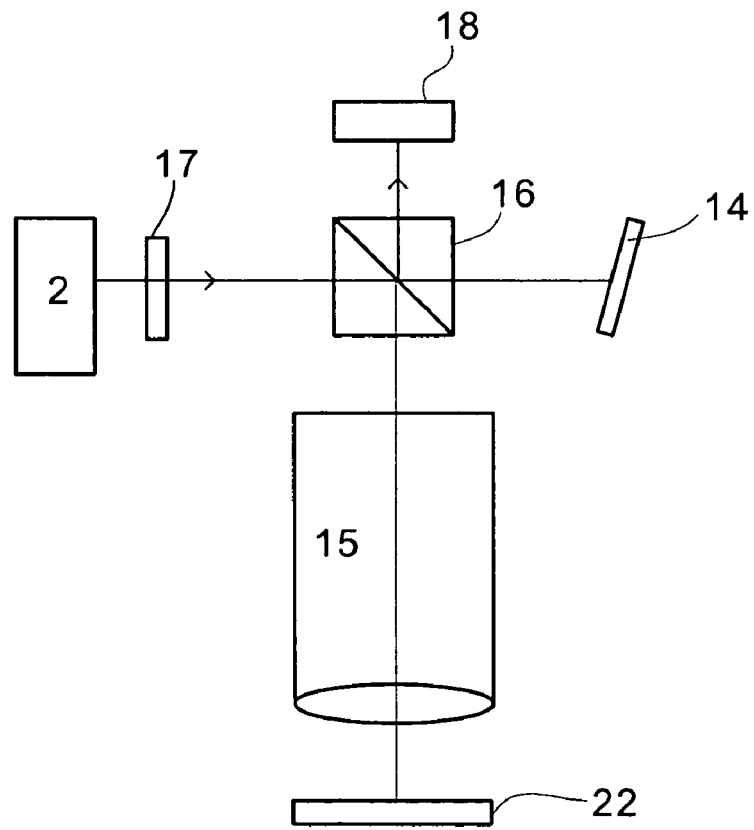
FIG. 5 depicts the apparatus used in a second step of the invention.
Figure 6:
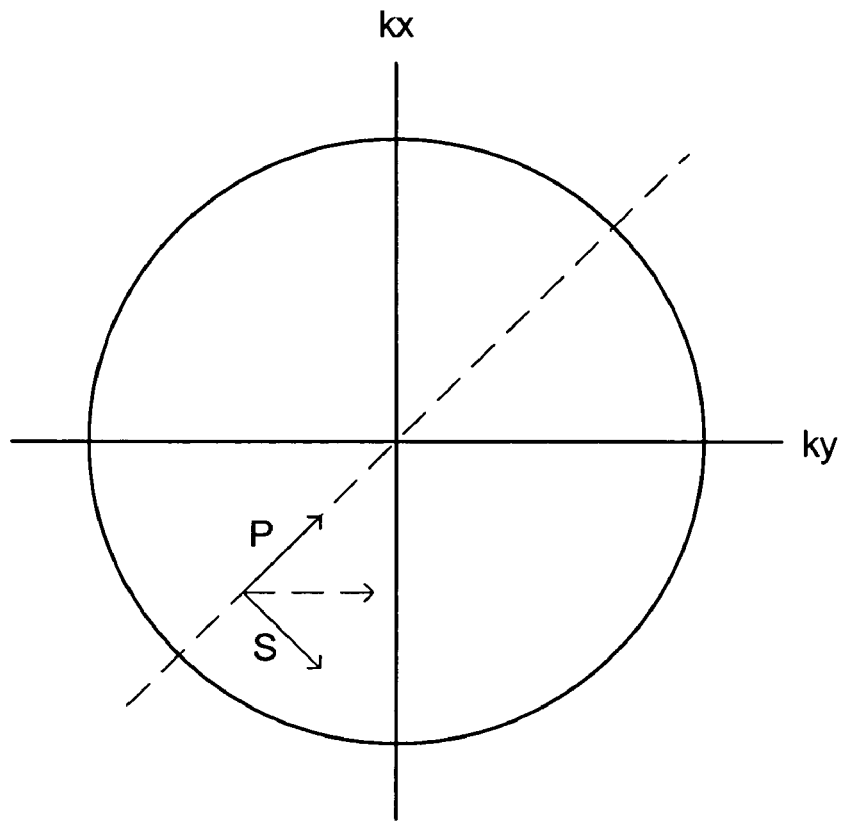
FIG. 6 depicts the pupil plane of the high aperture lens.

For the second step in the invention, shown in FIG. 5, a reference mirror 22 (e.g. an aluminium reference mirror) with a known reflection spectrum $R_{AL}$ is placed in the focal plane of the high aperture lens 15. The illumination beam is reflected by the beam splitter 16, through the high aperture lens 15, reflected by the reference mirror 22 and projected back to the high aperture lens and beam splitter towards CCD detector 18. As discussed above S and P polarizations suffer different transmission losses through the high aperture lens. For azimuthal angles of 0° and 90° in the pupil plane there will only be P and S polarized light respectively. Thus the measured CCD for azimuthal angles of 0° and 90° will be:

$$M_{AL,P}(k_x,0)=S_{CCD}T_{BS}R_{BS}T_{OBJ,P}^2(k_x,0)R_{AL,P}I_{ill}(k_x,0)$$

$$M_{AL,S}(0,k_y)=S_{CCD}T_{BS}R_{BS}T_{OBJ,S}^2(0,k_y)R_{AL,S}I_{ill}(0,k_y)$$

where $T_{OBJ}$ is the transmittance of the high aperture lens 15.

The measured quantities $M_{ill}$, $M_{AL,P}$ and $M_{AL,S}$ can then be used to find the transmission losses for P and S polarized light for the high aperture lens:

$$\frac{M_{AL,P}(k_x, 0)}{M_{ill}(k_x, 0)} = T_{OBJ,P}^2(k_x, 0)\frac{R_{AL,P}}{R_{ref}}$$

$$\frac{M_{AL,S}(0, k_y)}{M_{ill}(0, k_y)} = T_{OBJ,S}^2(0, k_y)\frac{R_{AL,S}}{R_{ref}}$$

It is not necessary to know the reflectance $R_{ref}$ of the reference mirror because the transmission of the lens can be normalised: it is more important to know the relative transmission losses between the S and P polarized light.

Once the transmission losses for the P and S polarized light have been found these can then be used to improve the scatterometry measurements by factoring in the transmission losses to the detected scatterometry beam.

Figure 7:
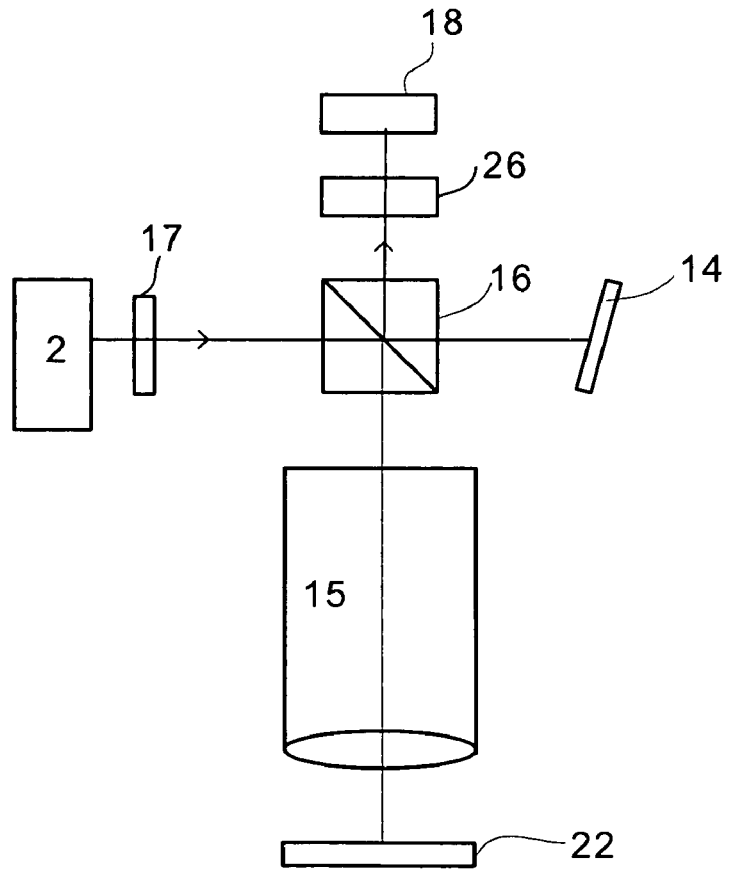
FIG. 7 depicts an optional additional step in the invention.

The measurements described above only calibrate the transmission losses for S and P polarized light but small phase shifts may also be introduced between the S and P components of the transmitted radiation. To calibrate the phase shift, a cross polarizer 26 may be placed in the path of the beam of radiation and a reference mirror 22 is again placed in the focal plane of the high aperture lens 15. This is shown in FIG. 7. The transmitted radiation detected by CCD detector will be sensitive to phase shifts between S and P polarized light, particularly at an azimuthal angle of 45°. With no phase shift between the P and S polarized light the light will remain linearly polarized and the CCD detector will detect very little radiation. However for a 180° phase shift the plane of polarization will change and the light transmitted by the crossed polarizer 26 will be large.

It is therefore possible to improve the modelling of the angle resolved spectrum and furthermore this can be achieved using relatively low cost and standard optical components such as a reference mirror.

Although specific reference may be made in this text to the use of lithographic apparatus in the manufacture of ICs, it should be appreciated that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A method for characterizing transmission losses in an optical system, comprising:
   splitting a radiation beam into a reference portion and a measurement portion;
   during a measurement of the reference portion, detecting an illumination profile of the reference portion reflected from a moveable reference mirror in a first position;
   during a measurement of the measurement portion, detecting an illumination profile of the measurement portion after the radiation beam has traveled through the optical system and detecting the illumination profile of the reference portion reflecting from the reference mirror in a second position, the second position being different than the first position; and
   comparing the illumination profile of the reference portion to the illumination profile of the measurement portion to characterize the transmission losses in the optical system.

2. The method of claim 1, wherein the comparing comprises characterizing transmission losses for P and S polarized light.

3. The method of claim 2, wherein the characterizing of the transmission losses for P and S polarized light comprises projecting a linearly polarized radiation beam through the optical system and measuring a transmission of polarization components parallel to and perpendicular to the linear polarization.

4. The method of claim 1, wherein the detecting of the illumination profile of the measurement portion comprises measuring the measurement portion in a back focal plane of the optical system, a substrate with known reflectivity being placed in a focal plane of the optical system.

5. The method of claim 4, wherein the substrate with known reflectivity comprises a mirror.

6. The method of claim 1, wherein the detecting of the illumination profiles of the reference and measurement portions comprises using at least one of a CCD device and a CMOS device.

7. The method of claim 1, wherein the detecting of the illumination profile of the reference portion comprises measuring a reflection of the radiation beam by the moveable reference mirror.

8. The method of claim 1, further comprising:
   placing a cross polarizer in the path of the radiation beam after projection through the optical system; and
   measuring an intensity distribution of a radiation beam projected through the optical system and the cross polarizer.

9. The method of claim 1, wherein:
   during the measurement of the reference portion, the moveable reference mirror is in the first position and directs the reference portion to a first portion of a detector; and
   during the measurement of the measurement portion, the moveable reference mirror is in the second position and directs the measurement portion to the first portion and directs the reference portion to a second portion of the detector, wherein the first portion is different than the second portion of the detector.

10. A method for measuring properties of a substrate, comprising:
    projecting a radiation beam onto the substrate, wherein the radiation beam is directed through an optical system;

detecting an intensity distribution of a reflected radiation beam that is indicative of the properties of the substrate;

characterizing transmission losses of the optical system by splitting the radiation beam into a reference portion and a measurement portion;

during a measurement of the reference portion, detecting an illumination profile of the reference portion reflected from a moveable reference mirror in a first position, during a measurement of the measurement portion, detecting an illumination profile of the measurement portion after the radiation beam has traveled through the optical system and detecting the illumination profile of the reference portion reflecting from the reference mirror in a second position, the second position being different than the first position, and comparing the illumination profile of the reference portion to the illumination to the illumination profile of the measurement portion to characterize transmission losses in the optical system; and subtracting the transmission losses from the reflected radiation beam.

11. The method of claim 10, wherein the comparing comprises characterizing transmission losses for P and S polarized light.

12. The method of claim 11, wherein the characterizing of the transmission losses for P and S polarized light comprises directing a linearly polarized radiation beam through the optical system and measuring a transmission of polarization components parallel and perpendicular to the linear polarization.

13. The method of claim 10, further comprising:
placing a cross polarizer in the path of the radiation beam after traveling through the optical system; and
measuring an intensity distribution of the radiation beam projected through the optical system and the cross polarizer.

14. An inspection apparatus configured to measure a property of a substrate, comprising:
a radiation projector configured to project a radiation beam through an optical system onto the substrate;
a detector configured to detect radiation reflected from the substrate;
a moveable reference mirror;
a data handling unit configured to normalize the detected radiation beam by taking into account the transmission losses from P and S polarized light, wherein the data handling unit characterizes the transmission losses by,
splitting the radiation beam into a reference portion and a measurement portion;
during a measurement of the reference portion, detecting an illumination profile of the reference portion reflected from a reference mirror in a first position;
during a measurement of the measurement portion, detecting an illumination profile of the measurement portion after the radiation beam has traveled through the optical system and detecting the illumination profile of the reference portion reflecting from the reference mirror in a second position, the second position being different than the first position; and
comparing the illumination profile of the reference portion to the illumination profile of the measurement portion to characterize the transmission losses in the optical system.

15. The inspection apparatus of claim 14, further comprising a data table configured to store the transmission losses suffered by P and S polarized light.

16. The inspection apparatus of claim 14, wherein the radiation projector is configured to project a linearly polarized radiation beam and the detector is configured to detect transmission of polarization components parallel to and perpendicular to the linear polarization.

17. The inspection apparatus of claim 14, wherein the data handling unit is configured to measure the measurement portion in a back focal plane of the optical system, a substrate with known reflectivity being placed in the focal plane of the optical system.

18. The inspection apparatus of claim 17, wherein the substrate with known reflectivity comprises a mirror.

19. The inspection apparatus of claim 14, wherein the data handling unit is configured to detect the illumination profiles of the reference and measurement portions with at least one of a CCD device and a CMOS device.

20. The inspection apparatus of claim 14, wherein the data handling unit is configured to detect the illumination profile of the reference portion from a reflection of the radiation beam by the moveable reference mirror.

21. The inspection apparatus of claim 14, further comprising a cross polarizer located in the path of the radiation beam after projection through the optical system, wherein the data handling unit is configured to measure an intensity distribution of a radiation projected through the optical system and the cross polarizer.

* * * * *